United States Patent [19]

Riedel

[11] Patent Number: 5,101,206
[45] Date of Patent: Mar. 31, 1992

[54] INTEGRATING ANALOG TO DIGITAL CONVERTER

[75] Inventor: Ronald J. Riedel, Loveland, Colo.

[73] Assignee: Hewlett-Packard Company, Palo Alto, Calif.

[21] Appl. No.: 446,232

[22] Filed: Dec. 5, 1989

[51] Int. Cl.$^5$ .................. H03M 1/10; H03M 1/14
[52] U.S. Cl. ................... 341/156; 341/120; 341/167; 341/168
[58] Field of Search ............... 341/156, 120, 166–170

[56] References Cited

U.S. PATENT DOCUMENTS

| 4,318,086 | 3/1982 | Peck et al. | 341/156 |
| 4,485,372 | 11/1984 | Holloway | 341/156 |
| 4,654,635 | 3/1987 | Van De Plassche | 341/156 |

OTHER PUBLICATIONS

HP Journal, Apr. 1989, vol. 40, No. 2 "An 8½ Digit Integrating A/D Converter with 16-Bit, 100,000 Sample-per-Second Performance" by Wayne Goeke, pp. 8–14.
HP Journal, Feb. 1986, vol. 37, No. 2 "Seven-Function System Multimeter Offers Extended Resolution and Scanner Capabilities" by Scott Stever et al. pp. 15–23.
HP Journal, Apr. 1981, vol. 32 No. 4, "Precision DVM Has Wide Dynamic Range and High Systmes Speed" by Lawrence T. Jones, James Rassmeyer and Charles Clark, pp. 23–31.

*Primary Examiner*—William M. Shoop, Jr.
*Assistant Examiner*—Sharon D. Logan

[57] ABSTRACT

An integrating analog-to-digital converter (ADC) which calculates the coarse portion of its output by integrating an input analog signal over a predetermined number of time intervals during runup using a known technique to define the analog signal in terms of a slope count. The invention is particularly characterized in that an ADC is used in lieu of rundown of the integrator voltage to calculate the fine portion of the ADC output also in terms of slope count. This is accomplished by converting the residual analog signal remaining at the end of runup into a fractional slope count which can be added to the slope count determined during runup so that the resulting total slope count is directly proportional to the input voltage. To maintain linearity, calibration of the circuit is necessary and is accomplished by calculating a calibration constant which relates the ADC reading to slope count. The resulting calibration constant is then multiplied by the ADC output representative of the residual integrator voltage in order to determine the slope count representative of the residual integrator voltage. Such calibration is performed periodically in order to account for time and temperature fluctuations caused by ambient conditions.

38 Claims, 6 Drawing Sheets

INTEGRATING ANALOG TO DIGITAL CONVERTER

BACKGROUND OF THE INVENTION

1. Field of the Invention

The present invention relates to an integrating analog to digital converter (ADC), and more particularly, to an integrating ADC in which the residual integrator voltage at the end of "runup" is determined using a conventional ADC in lieu of "rundown".

2. Description of the Prior Art

Integrating ADCs having up to 8 ½ digit (28-bit) resolution and 7 ½ digit (25-bit) integral linearity are known.. Integrating ADCs have been used in the prior art because of their ability to make high-resolution measurements; however, integrating ADCs have previously been relatively slow. Numerous attempts have been made to increase the speed of such integrating ADCs without adversely affecting the resolution of the output. However, such efforts have met with limited success since the speed of the integrating ADC is generally inversely proportional to the resolution of the output. In other words, in integrating ADCs, speed has generally been traded off for resolution.

Such ADCs of the prior art now will be described in detail with reference to FIGS. 1-8.

FIG. 1 illustrates a prior art dual-slope type integrating ADC, while FIG. 2 shows a waveform diagram illustrating the principle of operation of the circuit of FIG. 1. A dual-slope type integrating ADC of the type shown operates by first shorting the integrator capacitor C by closing switch SW3 so that the integrator is at zero volts. Then, at time $t_0$, an unknown input voltage (the voltage to be measured), $V_{in}$, is applied to resistor R by closing switch SW1 for a fixed length of time $t_u$. The unknown input voltage $V_{in}$ is then integrated for the duration $t_u$, a period of time which is generally known as "runup". At the end of runup (i.e., when switch SW1 is opened), the output of the integrator, $V_0$, can be shown to be:

$$V_0(t_u) = -\frac{1}{RC} \int_o^t V_{in}(t)dt. \quad (1)$$

When $V_{in}$ is time invariant, Equation (1) reduces to:

$$V_0(t_u) = -\frac{V_{in}t_u}{RC}. \quad (2)$$

At the end of runup, a known reference voltage, $V_{ref}$, with a polarity opposite to that of $V_{in}$ is connected to the same resistor R by closing switch SW2. A counter is started at this time and is stopped when the output of the integrator crosses through zero volts as shown in FIG. 2. This period of capacitor discharge is generally known as "rundown". The counter contents at the time the integrator crosses through zero volts can be shown to be proportional to the unknown input $V_{in}$ as:

$$V_0(t_2) = V_0(t_u) - \frac{V_{ref}t_d}{RC} = 0, \quad (3)$$

where $t_d$ is the time required to complete rundown (i.e. $t_d = t_2 - t_u$ in FIG. 2). Then, by substituting Equation (2) into Equation (3) and solving for $V_{in}$:

$$V_{in} = -V_{ref}\left(\frac{t_d}{t_u}\right). \quad (4)$$

Finally, if $N_u$ is defined as the number of clock periods $T_{ck}$ during runup and $N_d$ is defined as the number of clock periods during rundown, time cancels from Equation (4) so that:

$$V_{in} = -V_{ref}\left(\frac{N_d}{N_u}\right). \quad (5)$$

Thus, in accordance with the prior art dual-slope type integrating ADC technique, the output is insensitive to the value of most of the circuit parameters because the values of R, C, and $T_{ck}$ all cancel from Equation (5). Moreover, in accordance with the prior art dual-slope type integrating ADC technique a single circuit can be designed to trade speed for resolution so that if the runup time is shortened the resolution will be reduced, as will the time required to make the measurement.

However, the prior art dual-slope type integrating ADC technique is disadvantageous in that the resolution and the speed are limited. In particular, the time $T_m$ required for a dual-slope type integrating ADC to make a measurement is determined by:

$$T_m = 2T_{ck}M, \quad (6)$$

where $T_m$ is the minimum theoretical time to make a full-scale measurement, $T_{ck}$ is the period of the ADC clock, and M is the number of counts of resolution in the full-scale measurement. Thus, as is apparent from Equation (6), for a clock frequency of 20 MHz measuring a signal with a resolution of 10,000 counts requires at least 1 millisecond. In addition, the resolution of the dual-slope type integrating ADC is limited by the wide band circuit noise and the maximum voltage swing of the integrator, for the wideband circuit noise has been found to limit how precisely the zero crossing can be determined. Since determining the zero crossing to an accuracy of greater than a millivolt is very difficult, the dual-slope technique generally only can provide four or five digits of resolution. For example, if the maximum voltage swing of the integrator is 10V and the accuracy is ±1mV, the resolution is 10V/1 mV = 10,000 counts, which is approximately 4 to 5 digits of resolution (i.e., 13 bits or $2^{13}$ counts).

The speed of the dual-slope type integrating ADC shown in FIG. 1 has been nearly doubled by using a pair of resistors, one for runup and the other for rundown, as shown in FIG. 3. In the ADC circuit of FIG. 3, the unknown voltage $V_{in}$ is connected through switch SW1 to resistor $R_u$. Similarly, reference voltage $V_{ref}$ is connected through switch SW2 to resistor $R_d$, which is much greater than the resistor $R_u$ used during runup. As a result, the runup time is shortened by the ratio of the two resistors while the same resolution is maintained during rundown, as shown in FIG. 4. The cost of the added speed is an additional resistor and a sensitivity to the ratio of the two resistors. In other words:

$$V_{in} = -V_{ref}\left(\frac{N_d}{N_u}\right)\left(\frac{R_u}{R_d}\right). \quad (7)$$

The time required for runup can be correspondingly reduced.

Another prior art integrating type ADC is shown in FIG. 5. FIG. 5 shows an integrating type ADC which utilizes multislope rundown to reduce the time to perform rundown. In other words, instead of using a single resistor for rundown (i.e., a single slope) as in the prior art embodiments of FIGS. 1-4, the multislope rundown circuit uses several resistors (i.e., multiple slopes) and seeks zero several times, each time more precisely as shown in FIG. 6. The ratio of one slope to another is the power of some number base, which for purposes of description is base 10.

As shown, four slopes are used having weights of 1000, 100, 10 and 1, and each slope is given a name denoting its weight and polarity. For example, $-R_b$ is a positive slope with 1000 counts per clock period while $R_b/10$ is a negative slope with 100 counts per clock period. A slope is considered to be positive if it transfers charge to the integrator, and since the integrator is an inverting circuit, it moves in a negative direction during a positive slope and vice-versa.

Runup occurs across resistor $R_a$ when switch SW3 is closed in the same manner as in either FIG. 1 or FIG. 3. However, multislope rundown begins at time $t_u$ by switching on the steepest slope, $-R_b$, by closing switch SW5 and opening switch SW3. This slope remains on until the integrator output crosses zero as shown in FIG. 6, at which time SW5 is opened and the next slope, $+Rb/10$, is turned on by closing switch SW2 until the output $V_o$ crosses back through zero. The slope $-Rb/100$ follows next by closing switch SW4, and when the output $V_o$ crosses back through zero, switch SW1 is then closed so that slope $+Rb/1000$ follows. Each slope thus determines the integrator's zero crossing ten times more precisely than the previous slope. In other words, each slope adds another digit of resolution to the rundown.

In the prior art embodiment of FIG. 5, if each slope is turned off within one clock period of crossing zero, each subsequent slope would require ten or fewer clock periods to cross zero. Thus, the theoretical time $t_4$ to complete a multislope rundown is:

$$t_d < NBT_{ck}, \quad (8)$$

where N is the number of slopes and B is the number base of the slope ratios. However, in practice the necessary time to complete rundown is higher because it is not always possible to turn off each slope within a clock period of its zero crossing. Delays in detecting the zero crossing and delays in responding by turning off the slopes cause the actual time for multislope rundown to be:

$$r_d < kNBT_{ck}, \quad (9)$$

where k is a factor greater than one. Thus, any delay in turning off a slope results in the integrator's output overshooting zero. As a result, for each clock period of overshoot, the following slope must take B clock periods to overcome the overshoot. Nevertheless, the multislope rundown technique shown in FIGS. 5 and 6 has resulted in an ADC which is 125 times faster than the equivalent dual-slope type integrating ADC of the type shown in FIGS. 1-4.

This multislope rundown technique has been optimized for even faster measurements by choosing the optimum base. In other words, by writing the number of slopes N as $\log_B(M)$, where M is the number of counts of resolution required from rundown, then $$t_d < kB\log_B(M)T_{ck}. \quad (10)$$

From Equation (10) it can be seen that base e is the optimum base for any required resolution. In fact, using base e in Equation (10) results in a rundown time which is 60% faster than the rundown time for a base of 10.

However, despite the significant improvement in speed, multislope rundown is more expensive to implement since a resistor network having several precision resistors and precise ratios must be provided. In particular, the tightest ratio tolerance is the reciprocal of the weight of the steepest slope and must be maintained to ensure linear ADC operation. Moreover, multislope rundown requires a more complex control circuit to control and accumulate the measurement. It is thus desirable to develop a rundown technique which can be implemented less expensively without sacrificing speed or simplicity.

On the other hand, the resolution of the ADC conversion also has been improved by modifying the runup technique. For example, multislope runup may be used for increasing the resolution of the ADC. Multislope runup is a modification of dual-slope runup whereby the ADC is allowed to have an effective voltage swing much larger than the physical limitations of the integrator circuit hardware. This technique involves periodically adding and subtracting a reference charge to or from the integrator input during runup such that the charge from the unknown input $V_{in}$ plus the reference charge $V_{ref}$ is never large enough to saturate the integrator. By accounting for the total amount of reference charge transferred to the integrator during runup and adding this number to the result of rundown, the resulting measurement can have much higher resolution. A circuit for implementing multislope runup is shown by way of example in FIG. 7.

As shown in FIG. 7, a precise amount of reference charge is generated by applying either a positive reference voltage $+V_{ref}$ to resistor $R_a$ via switch $SW_c$ or a negative reference voltage $-V_{ref}$ to resistor $R_b$ via switch $SW_b$ for a fixed amount of time. As a result, like multislope rundown, the positive voltage $V_{ref}$ adds charge to the integrator while the negative voltage $-V_{ref}$ subtracts charge from the integrator. If the circuit is designed such that currents across resistors $R_a$ and $R_b$ have equal magnitudes that are slightly greater than that of the current generated by a full-scale input signal, then the reference currents will always be able to remove the charge accumulating as a result of the input signal. Therefore, the integrator can be kept from being saturated by periodically sensing the polarity of the integrator output using a comparator, for example, and appropriately closing either switch $SW_a$ or $SW_b$ such that the integrator output is forced to move towards or across zero.

FIG. 8 shows a typical multislope runup waveform where the dashed line shows the effective voltage swing (without reference charge being put into the integrator). As can be seen from FIG. 8, the integrator output stays within the limits of the circuit while the effective voltage swing ramps far beyond the limit. Such a multislope runup technique thus has two distinct advantages over a dual-slope runup as shown in FIGS. 1–6. Namely, (1) the runup can be continued through any length of time without saturating the integrator, and (2) increased resolution can be achieved during runup as well as during rundown.

Although the multislope runup technique allows for improved resolution, when used with multislope rundown the resulting time period for a reading may be quite great for a high resolution output. For example, about 150 microseconds are required to perform multislope rundown alone for a resolution of about 6 digits. Moreover, dedicated high speed logic must be used for this purpose as well as custom integrated circuitry which is quite expensive. It is thus desirable to shorten the time period for rundown so that speed can be improved and to make the ADC more cost effective without sacrificing resolution and linearity. The present invention achieves these goals.

SUMMARY OF THE INVENTION

According to the invention, there is provided a high speed, high resolution and highly linear yet inexpensive analog-to-digital converter (ADC). The ADC of the invention comprises means for integrating an input analog signal over a predetermined number of time intervals, means for converting a residual analog signal remaining at the end of the predetermined number of time intervals into a residual digital signal, and means for calibrating the residual digital signal so as to represent a fractional number of slope counts. The integrating means provides an output signal that is positive for a number of the predetermined time intervals that corresponds to a positive slope count, and is negative for the remaining number of the predetermined time intervals that corresponds to a negative slope count. An output digital signal representing the digital equivalent of the analog input is then determined from a total slope count which has a magnitude substantially equal to the sum of (1) the fractional number of slope counts and (2) the difference between the positive and negative slope counts.

The ADC of the invention may also be used in a digital multimeter which measures and displays the voltage of an input analog signal. An apparatus according to this aspect of the invention comprises a multislope runup circuit for integrating the input analog signal over a predetermined number of time intervals, the multislope runup circuit ramping positive for a first number of the predetermined number of time intervals and ramping negative for a second number of the predetermined number of time intervals. The multimeter further comprises rundown circuitry including an analog-to-digital converter for converting a residual analog voltage output of the multislope runup circuit into a residual digital signal and calibrating means for representing the residual digital signal as at least one HPCO-29 fractional time interval of the multislope runup circuit, whereby the sum of (1) the at least one fractional time interval and (2) the difference between the first and second number of time intervals is substantially linearly proportional to the magnitude of the voltage of the input analog signal.

An analog-to-digital conversion method in accordance with the invention includes calibrating the residual ADC output so that it can be expressed in terms of slope counts. In particular, the method of converting an input analog signal into an output digital signal in accordance with this aspect of the invention comprises the steps of:

(1) integrating the input analog signal with an integrator over a predetermined number of time intervals, the integrated output being positive for a number of the predetermined time intervals corresponding to a positive slope count and negative for the remaining number of the predetermined time intervals corresponding to a negative slope count;

(2) converting, with a residual analog-to-digital converter, a residual analog signal remaining at the end of the predetermined number of time intervals into a residual digital signal;

(3) zeroing the integrator;

(4) removing all external inputs from the integrator to allow the integrator to ramp positive for a duration of one of the predetermined time intervals;

(5) after the duration of one predetermined time interval, sampling and storing the integrator output V1;

(6) rezeroing the integrator;

(7) removing all external inputs from the integrator to allow the integrator to ramp negative for a duration of one of the predetermined time intervals;

(8) after the duration of one predetermined time interval, sampling and storing the integrator output V2;

(9) calculating a calibration constant as the quotient of the magnitude of the full voltage range of the residual analog-to-digital converter divided by the sum of the absolute values of V1 and V2;

(10) calibrating the residual digital signal by effectively multiplying the residual digital signal by the calibration constant so as to represent a fractional number of slope counts; and

(11) calculating the output digital signal from a total slope count substantially equal to the sum of (1) the fractional number of slope counts and (2) the difference between the positive and negative slope counts.

BRIEF DESCRIPTION OF THE DRAWINGS

The objects and advantages of the invention will become more apparent and more readily appreciated from the following detailed description of the presently preferred exemplary embodiment of the invention taken in conjunction with the accompany drawings of which.

DETAILED DESCRIPTION OF THE PRESENTLY PREFERRED EMBODIMENT

Figure 10:
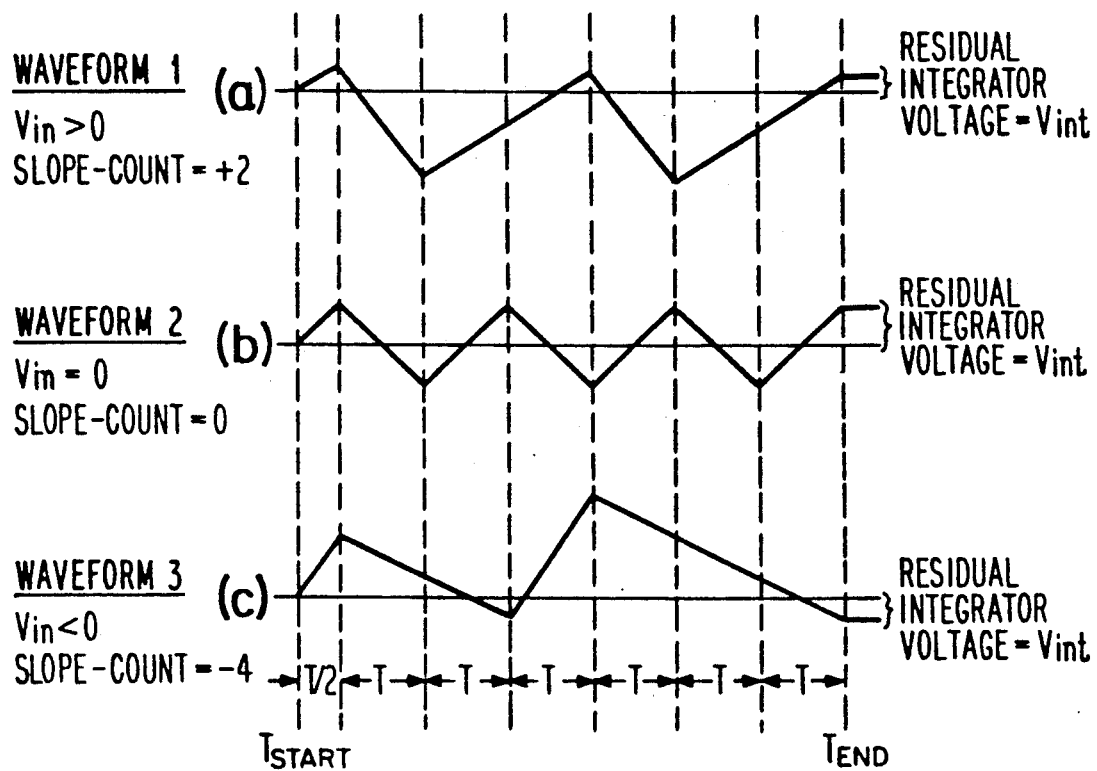
FIGS. 10(a)–(c) illustrate sample multislope runup waveforms for an input voltage $V_{in}$ greater than zero, equal to zero and less than zero, respectively.
Figure 11:
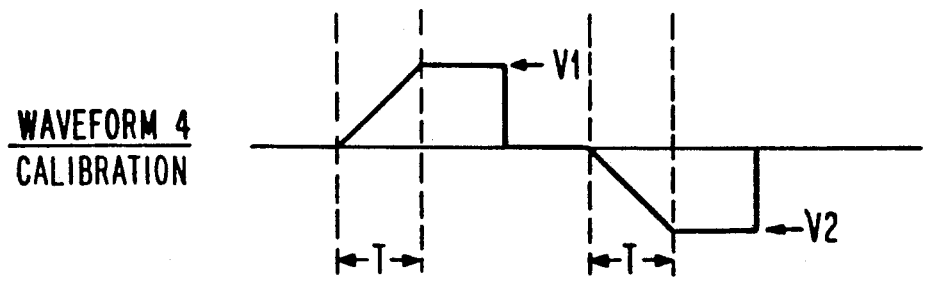
FIG. 11 illustrates a technique for the calibration of the ADC of FIG. 9, whereby the amount of residual charge left on the integrator after runup is converted to a fractional slope count by finding the amount of residual charge left on the integrator due to a change of one in the slope count in the positive and negative directions.

An integrating ADC in accordance with the preferred embodiment of the invention will be discussed with reference to FIGS. 9 through 11. The invention is described generally as an integrating ADC; however, it should be recognized by those of ordinary skill in the art that the ADC of the invention may be used in a digital voltmeter or multimeter, whereby the digital output voltage of the ADC of the invention is displayed to the user. Moreover, the description given herein is for exemplary purposes only and is not intended in any way to limit the scope of the invention. All questions regarding the scope of the invention may be resolved by referring to the appended claims.

Figure 1:
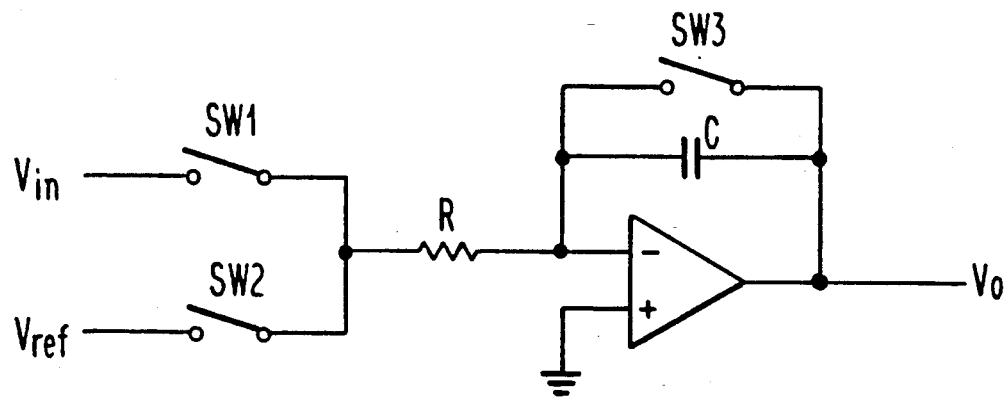
FIG. 1 schematically depicts a prior art dual slope integrating ADC.
Figure 2:
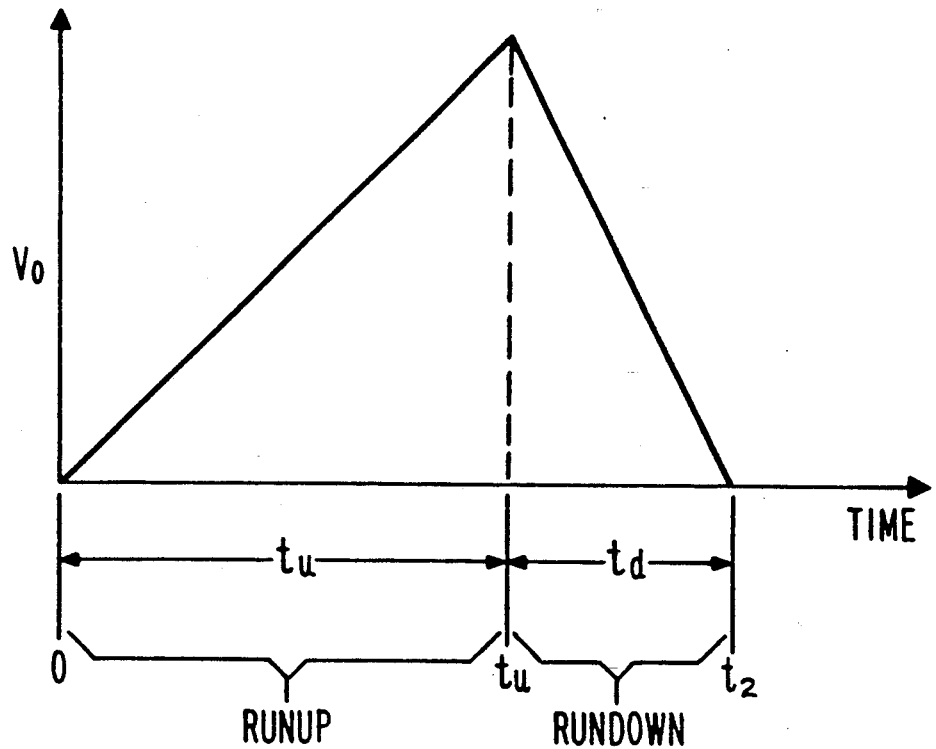
FIG. 2 illustrates a typical waveform of a dual-slope integrating ADC of the type shown in FIG. 1.
Figure 3:
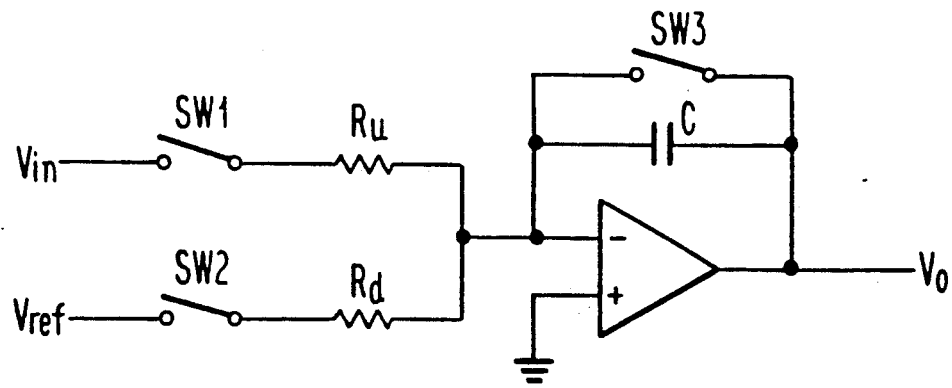
FIG. 3 schematically depicts a prior art enhanced dual-slope integrating ADC which uses two resistors, one for runup and one for rundown.
Figure 4:
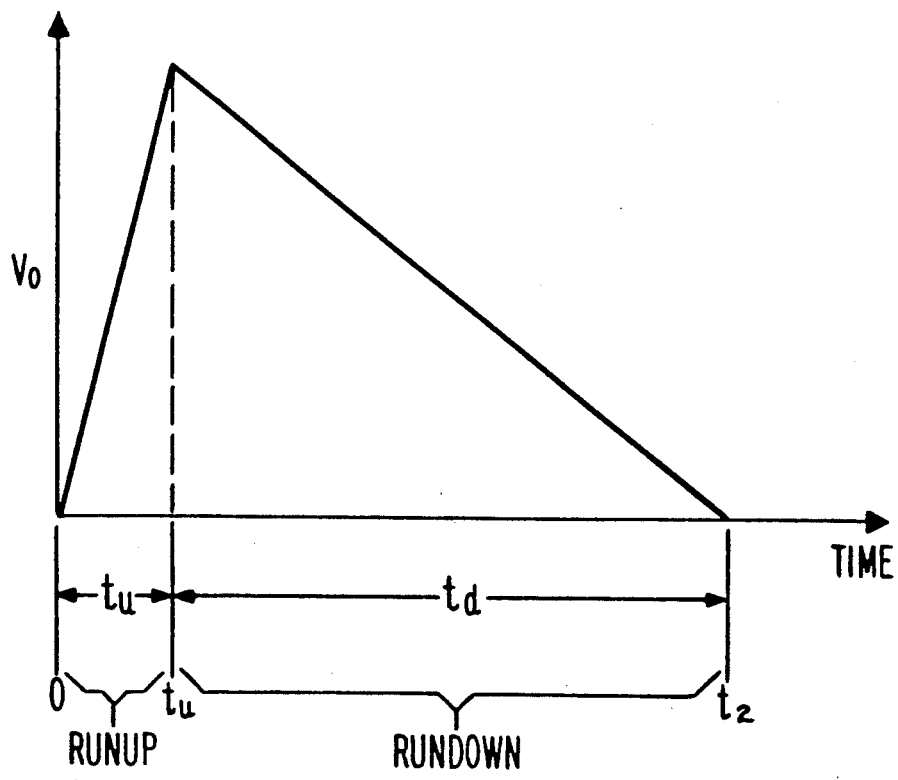
FIG. 4 illustrates a typical waveform for an enhanced dual-slope integrating ADC of the type shown in FIG. 3.
Figure 5:
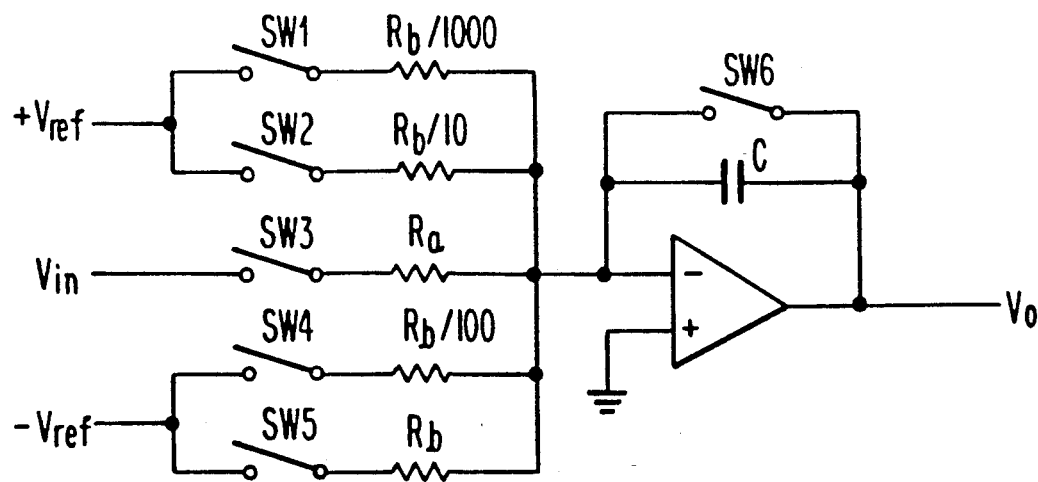
FIG. 5 schematically depicts a prior art integrating ADC which uses a multislope rundown technique.
Figure 6:
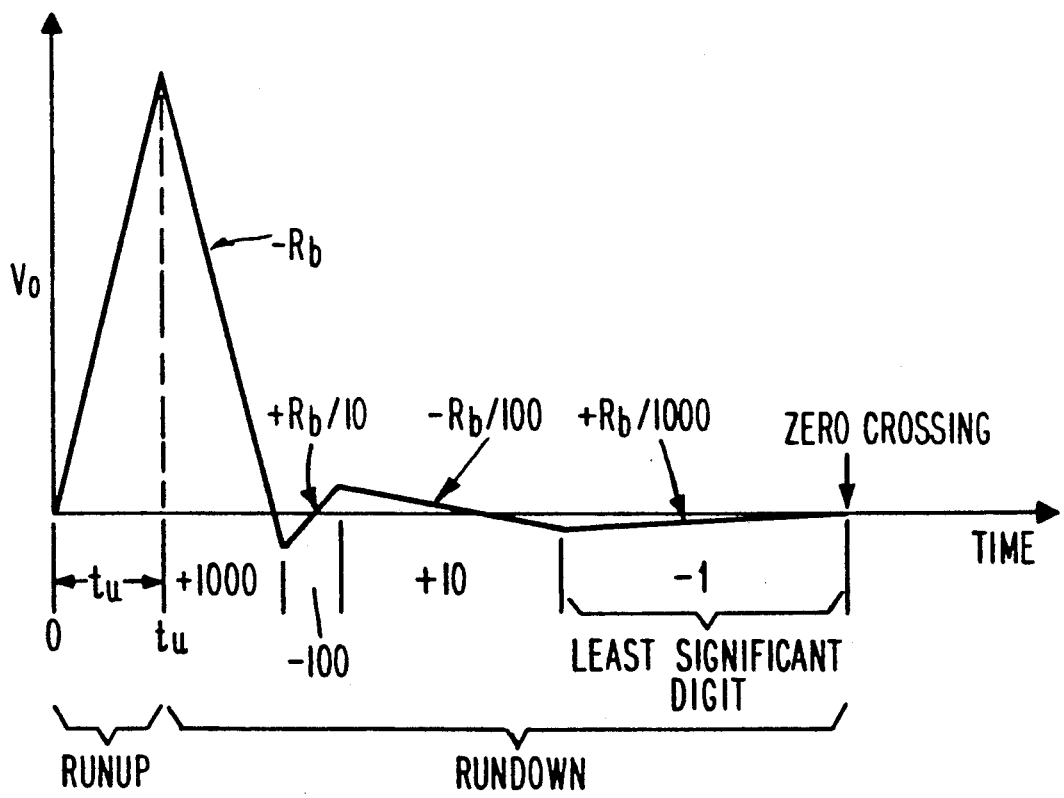
FIG. 6 illustrates a typical multislope rundown waveform of an integrating ADC of the type shown in FIG. 5.
Figure 7:
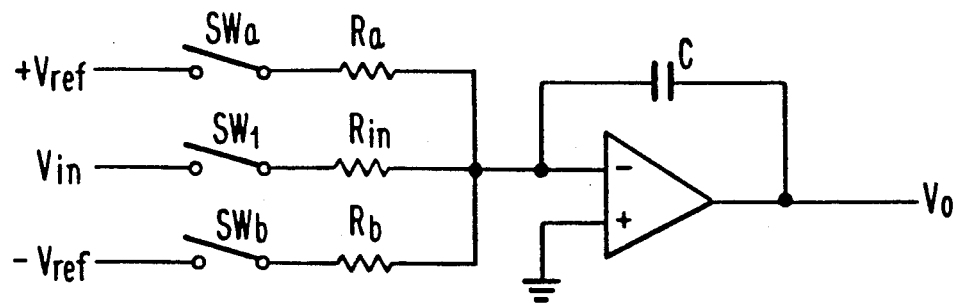
FIG. 7 schematically depicts a prior art integrating ADC which uses a multislope runup technique.
Figure 8:
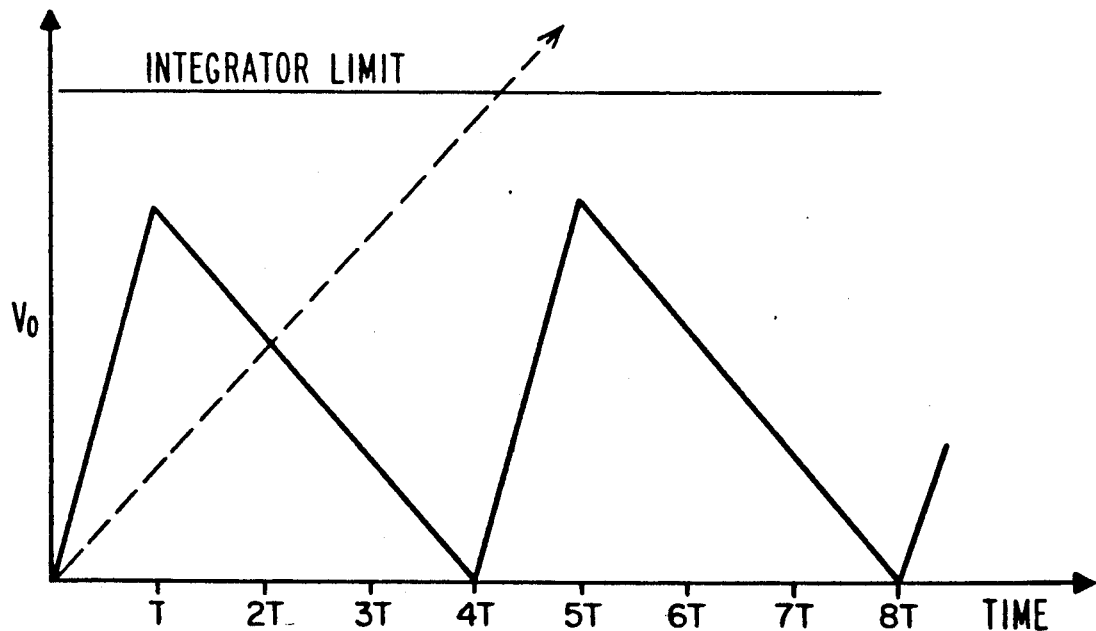
FIG. 8 illustrates a typical multislope runup waveform of an integrating ADC of the type shown in FIG. 7.

As in the prior art integrating ADCs described in the background portion of the specification, the ADC of the present invention operates in two phases, namely, runup and rundown. Runup may be performed in any known manner, including any of the techniques described in detail in the background portion of the specification; however, for purposes of description only, the multislope runup technique described with reference to FIGS. 7 and 8 will be used as the runup circuit in the embodiment of FIG. 9. Accordingly, although the runup phase of the ADC of the invention will be described as a multislope technique, it will be appreciated by those of ordinary skill in the art that any known runup integrating techniques such as dual-slope (which is one extreme of the multislope technique, i.e., one slope) may be used.

Runup in accordance with the invention will now be described with reference to FIGS. 9 and 10(a)–(c).

Figure 9:
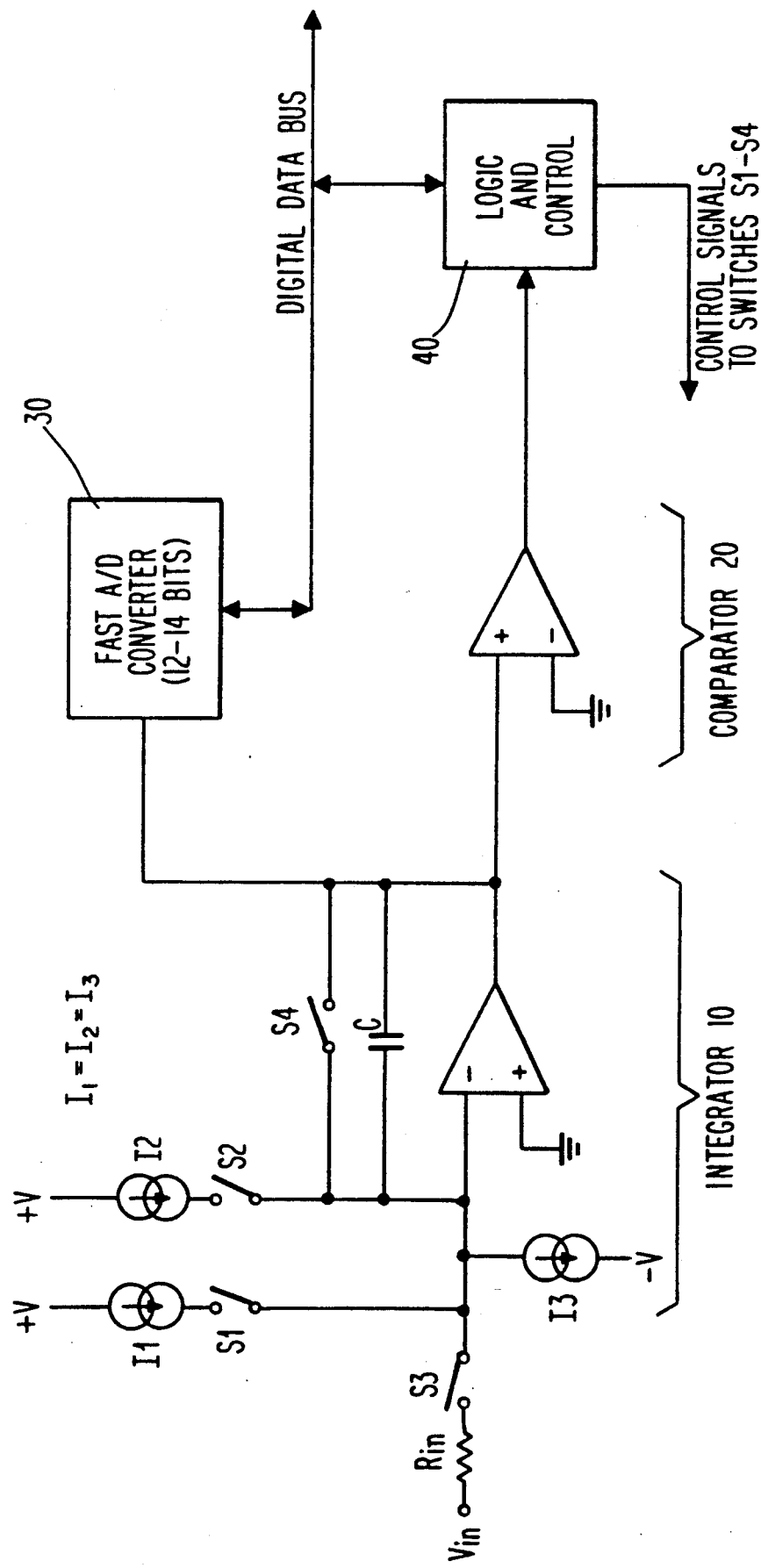
FIG. 9 schematically depicts an integrating ADC in accordance with a preferred embodiment of the present invention.

As shown in FIG. 9, the ADC of the invention is comprised of an integrator 10 (as in prior art multislope runup circuits), a comparator 20, a residual ADC 30, and a logic and control circuit 40. Integrator 10 is generally of the type described with respect to FIG. 7, while comparator 20 may be any device which can determine whether the integrator 10 output is greater than or less than zero. ADC 30 may be any commercially available fast ADC of a sufficient resolution, such as an Analog Devices AD7572 or a Burr-Brown PCM78. An ADC having 12–14 bits is shown in FIG. 9. Finally, logic and control circuit 40 may be a microprocessor or a comparable circuit capable of sampling and analyzing the outputs of comparator 20 and ADC 30 so as to provide control signals to switches S1–S4 in accordance with the method to be described below.

During operation of the embodiment of FIG. 9, switch S4 is initially closed and switch S3 is open, and the output of the integrator 10 is at zero. At the start of a measurement, switch S4 is then opened and switch S3 is closed, and switches S1 and S2 are opened by logic and control circuit 40. The output of the integrator 10 then begins to ramp positive as shown in Waveforms 1–3 in FIGS. 10(a)–10(c) due to the input $V_{in}$ in combination with current source I3. The integrator 10 is instructed by logic and control circuit 40 to ramp positive for a duration T/2 as shown so that runup always starts in the same direction for improved accuracy (this time period must be accounted for in the calibration equations as will be described below). After a time period T/2, switches S1 and S2 are closed, and the integrator 10 then begins to ramp negative at a rate determined by the relative values of input voltage $V_{in}$, resistance $R_{in}$, and the current sources I1, I2 and I3 (where I1=I1=I3).

After another time period T, the state of the comparator 20 is tested. If the output is negative, switches S1 and S2 are opened, and the integrator 10 again begins to ramp positive, as shown in Waveform 1 of FIG. 10(a). On the other hand, if the comparator 20 output is positive, switches S1 and S2 remain closed, and the integrator 10 continues to ramp negative, as shown in Waveform 3 of FIG. 10(c). This process continues for as many time periods T as desired for the required resolution (the more time periods T used, the greater the resolution).

The number and duration of time periods T are dependent upon the AC power line noise. In particular, it is desirable to eliminate the effects of the 60Hz AC power line noise by setting the time period T to be an integral fraction of the power line cycle. For example, a 60Hz power line has a cycle period of 1/60 sec, which will have minimal effect on the ADC reading if the integration period is NT=X/60 sec, where N and X are integers and T is the duration of each sample period. In this manner, any unnecessary AC power line noise spikes will be rejected.

As is apparent from FIGS. 10(a)–(c), the waveforms from the integrator 10, as well as the comparator 20 output, are dependent upon the sign and magnitude of the input voltage. For example, FIG. 10(a) shows the waveform for a positive input voltage $V_{in}$ whereby the integrator 10 slopes negative at a faster rate than it ramps positive (due to the inverting effect of the integrator). As a result, the overall slope count is positive, where the slope count during runup corresponds to the number of time intervals of length T during which the integrator 10 is ramping positive minus the number of intervals of length T during which integrator 10 is ramping negative. In FIG. 10(b), on the other hand, for an input voltage $V_{in}$ of zero the resulting slope count is equal to zero since the integrator 10 ramps at the same rate in the positive and negative directions. Finally, in FIG. 10(c), for a negative input voltage the integrator 10 ramps positive at a greater rate than it ramps negative so that a negative slope count results. Thus, the integrator 10 output has a steeper slope in a given direction in accordance with the magnitude of the input voltage, while the direction is determined at comparator 20 in accordance with the sign of the input voltage.

Thus, as just described, a measure of the magnitude of the input voltage $V_{in}$ may be obtained by computing the number of time periods T during which the comparator 20 output is negative (or, equivalently, the integrator is ramping positive) minus the number of time periods T during which the comparator 20 output is positive (integrator is ramping negative). Logic and control unit 40 then samples the output of comparator 20 and computes the slope count. The slope count is then used as the most significant part of the total ADC reading. The input voltage is measured in this manner during runup to a resolution determined by the number of time periods T in the measurement cycle. For example, 100 time periods T would imply a resolution of one part in 100, and of course, as the number of time periods T during runup is increased, the output resolution is correspondingly increased.

An arbitrarily high resolution may be theoretically obtained using the above-described technique by waiting the necessary number of time periods T for integrating during runup. However, the reading rate must not be too slow to be practical. For example, to get a six-digit (1,000,000 counts) reading, one million time periods T would be necessary. Thus, if T has a duration of 8 microseconds, one reading would take eight seconds, an unacceptably long time. Accordingly, to get extra resolution in less time, the runup portion is usually stopped after about 2,000 periods of duration T (about 16 milliseconds). This gives a resolution of 2,000 counts (about 11 bits). The additional required bits of resolution required for 6½ digit output, for example, are obtained through rundown, as will be described below with reference to FIGS. 9 through 11.

During rundown, the present invention functions as a successive approximation converter for calculating the residual voltage remaining after runup. Also, the rundown calibration technique used in accordance with the invention functions to eliminate error introduced into the system due to changes in the capacitor voltage caused by time and temperature variations. Such inaccuracies are accounted for in the equations K and K1 as described below. The invention thus functions to use successive approximation conversion to measure the residual integrator voltage in lieu of rundown.

In particular, at the end of runup, switches S3 and S1 are opened (FIG. 9). The integrator 10 is thus in a balanced state of input, and the output remains constant, at least for a short period of time, as shown at the right-hand portions of FIGS. 10(a)–(c). As shown, the output voltage of the integrator 10 will not necessarily be at zero volts at the end of runup and will ordinarily vary from zero depending on the exact value of the input voltage. The remaining voltage is shown in FIGS. 10(a)–(c) as residual integrator voltage $V_{int}$, and the extra bits of the ADC resolution can be computed by precisely measuring the residual charge left on the integrator 10 at the end of runup.

As noted in the background portion of the specification, prior art circuits perform rundown with a complex set of precision resistor networks or fractional current sources of value I/10, I/100 and I/1000, all carefully matched to each other and to I1, I2 and I3. By switching these currents into the integrator 10 in turn and monitoring the comparator 10 output, the output of the integrator 10 could be forced to zero. Also, by counting how long each current source was enabled, a measure of the charge left on the integrator 10 could be obtained, and the extra bits of resolution computed. As noted above, this process of zeroing, or multislope rundown of the integrator 10 to zero volts can be precise and accurate, but it is also quite slow. Moreover, such a technique requires precision components which are expensive.

Accordingly, the present invention instead uses in lieu of rundown a technique of directly measuring the residual integrator output voltage using a commercial off-the-self ADC 30 such as an Analog Devices AD7572 or a Burr-Brown PCM78. Since the integrator 10 output voltage need only be measured to a resolution of about 11 bytes to provide the 9 or 10 extra bits necessary to make a 6-digit ADC (the last couple of bits are dropped off due to noise), any ADCs for 11 or more bits and which are sufficiently fast may be used for this purpose. When such an ADC is used, the value of the residual integrator voltage may be measured and mathematically combined with the slope count obtained during runup to provide the full 6-digit answer. As will be described below, for this technique to work, the integrator 10 output during rundown must be converted to a fractional slope count and calibrated so that an accurate reading will result.

In accordance with the invention, the slope count and residual integrator voltage during rundown are combined to represent the actual applied input voltage $V_{in}$ in accordance with the following basic equation:

$$V_{in} = \frac{G*(K*C*V_{int} - T*I(\text{slope count} + 1/2)}{T_{end} - T_{start}} \qquad (11)$$

where:

$V_{in}$ = unknown input voltage to be measured;
G = overall gain constant, nominally equal to $1/R_{in}$;
K = a proportionality constant calculated as discussed below;
C = nominal value of the integrator capacitor;
$V_{int}$ = residual integrator voltage after runup;
T = time duration of each slope period;
I = I1 = I2 = I3, the value of the current sources;
slope count = number of intervals T the integrator is ramping positive minus the number of intervals T the integrator is ramping negative; and
$T_{end} - R_{start}$ = total time length of the integration.

Equation (11) can be written as:

$$V_{in} = \frac{G}{T_{end} - T_{start}} * T*I \left( \frac{V_{int}*K*C}{T*I} + (\text{slope count} + 1/2) \right) \qquad (12)$$

Equation (12) as so written consists of two terms, one proportional to the residual integrator voltage $V_{int}$ and the other proportional to the slope count during runup. The slope count term can change only by integer values of slope count and thus represents the most significant or "coarse" part of the ADC reading. The term proportional to $V_{int}$, on the other hand, represents a fractional part of a slope count and thus provides the least significant or "fine" part of the ADC reading.

All of the parameters of Equation (12) are easily measured and understood with the exception of constant K. As is clear from Equation (12), the term $K*C/(T*I)$ relates the value of the residual integrator voltage $V_{int}$ to an equivalent fraction of a slope count so that the two terms in Equation (12) can be added together properly. Theoretically, K has the value:

$$K = \frac{2*T*I/C}{T(I + i)/(C + c)} , \qquad (13)$$

where:

C = nominal value of integrator capacitor;
c = signed value of error in value of C;
I = nominal value of current sources; and
i = signed value of error in value of I.

Thus, to accurately calculate K, the circuit of the invention must have means for accurately measuring the error values c and i. Since these values change with temperature and time, the ADC of the invention must be able to measure these values, directly or indirectly, in order to derive the value for K. Unless this is properly done, the ADC output will change calibration and become nonlinear, possibly even nonmonotonic as environmental conditions change.

Accordingly, an algorithm has been developed in accordance with the invention for automatically finding the value of K. This is accomplished by calibrating the ADC so that the value of K is indirectly found, and this process will be described in further detail below with respect to Waveform 4 of FIG. 11.

In order to calibrate the ADC of the invention, switches S1, S2 and S3 are opened and switch S4 is closed, thereby zeroing the integrator 10. Then, switch S4 is opened so that the integrator 10 is allowed to ramp positive with no external input for a time T as shown in FIG. 11. Then, at time T, a sample of the integrator 10 output is taken and measured by the ADC 30. This reading is stored as V1 as shown in FIG. 11. Then, switch S4 is closed so as to rezero the integrator, and switches S1 and S2 are also closed. Switch S4 is then opened, and integrator 10 is allowed to ramp negative with no external input for time T as shown in FIG. 11. Then, after another interval T, a second sample of the integrator 10 output is taken and measured by the ADC 30. This reading is stored as V2 as shown in FIG. 11. The difference between the stored values, $V1 - V2$, thus represents the amount of residual charge left on the integrator due to a change of one in the slope count in the positive and negative directions.

A second constant, K1, which is defined as $K1 = K*C/(T*I)$, is then computed as $K1 = FS/(V1-V2)$, where FS is the full scale range from a maximum positive value to a maximum negative value convertible by ADC 30. In other words, using this definition of constant K1, the expression $V_{int}*K1$ directly converts the output voltage of the ADC 30 reading of $V_{int}$ into fractions of a slope count. For example, if the full scale range of the ADC 30 is $\pm 3V$, the full scale range $FS=6V$. Then, for a calibration reading of $V1=2.5V$ and $V2=-2.3V$, $V1-V2=4.8$ volts. Thus, $K1=6V/4.8V=1.25$. Accordingly, the fractional part of the ADC reading (i.e., the output of ADC 30) is multiplied by calibration constant 1.25 in order to determine the corresponding number of fractional slope counts for a given ADC 30 reading.

Thus, in accordance with the invention, actual measurements are computed by logic and control circuit 40 with the following formula:

Total Slope Count = (14)

Slope count (runup) + K1 (A/D converter 20 reading)

Then, to get the final reading of the ADC of the invention, the total slope count is multiplied by a global calibration constant C1 which is derived when the ADC is calibrated to an external standard. In other words:

$V_{in}$ (measured) = C1*(Total Slope Count)  (15)

where $C1 = \dfrac{G*T*I}{T_{end} - T_{start}}$.

Accordingly, the effect of the reading by ADC 30 of the residual integrator voltage is to extend the total ADC resolution by adding a fractional part of a slope count to the integer number of slope counts obtained during runup. For example, if ADC 30 is chosen to have 12 to 14 bits as shown in FIG. 9, approximately 11 bits of resolution may be added to the ADC output (allowing for a couple of bits of noise).

The above-described calibration algorithm for finding values for K1 and K must be executed periodically during measurements in order to keep the ADC linear and calibrated. Moreover, the calibration particularly needs to be performed if environmental conditions change so as to significantly affect the values of c and i. During normal execution of this calibration algorithm by logic and control circuit 40, only approximately one millisecond is required. Consequently, 6-digit resolution as well as linearity for a reading rate of greater than 25 readings per second is made possible in accordance with the invention using only commercially available off-the-shelf parts and the above-described calibration method.

The present invention has the beneficial features that only about 15 microseconds are required to perform rundown since a dedicated high speed logic circuit need not be used for rundown, a ten time speed improvement over the multislope rundown technique of the prior art. Moreover, the circuit of the invention is less expensive than those of the prior art in that a commercially available 12–14 bit ADC may be used as ADC 30, thereby lowering cost.

Although a single exemplary embodiment of the invention was described in detail above, those skilled in the art will readily appreciate the many additional modifications are possible in the exemplary embodiment without materially departing from the novel teachings and advantages of this invention. For example, logic and control circuit 40 need not be a microprocessor programmed to perform the indicated calculations but instead may be a programmable logic array. Accordingly, all such modifications are intended to be included within the scope of this invention as defined in the following claims.

I claim:

1. An analog-to-digital converter for converting an input analog signal into an output digital signal, comprising:

means for integrating said input analog signal over a predetermined number of time intervals, the integrated output being positive for a number of said predetermined time intervals corresponding to a positive slope count and negative for the remaining number of said predetermined time intervals corresponding to a negative slope count;

means for converting a residual analog signal remaining at the end of said predetermined number of time intervals into a residual digital signal; and means for calibrating said residual digital signal so as to represent a fractional number of slope counts, whereby the output digital signal is determined from a total slope count substantially equal to the sum of (1) said fractional number of slope counts and (2) the difference between said positive and negative slope counts.

2. An analog-to-digital converter as in claim 1, wherein said integrating means comprises a multislope runup circuit.

3. An analog-to-digital converter as in claim 2, wherein said converting means comprises a residual analog-to-digital converter.

4. An analog-to-digital converter as in claim 3, wherein said calibrating means calibrates said residual digital signal by effectively multiplying said residual digital signal by a calibration constant.

5. An analog-to-digital converter as in claim 4, wherein said calibration constant has a magnitude substantially equal to a magnitude of a full scale voltage of said residual analog-to-digital converter divided by a sum of a absolute values of respective residual voltages left on said multislope runup circuit due to a change of one in the positive slope count and a change of one in the negative slope count when no external input is applied to said multislope runup circuit.

6. An analog-to-digital converter as in claim 5, wherein a magnitude of said total slope count substantially equals a sum of (1) a difference between said positive and negative slope counts and (2) a product of said calibration constant with said residual digital signal.

7. An analog-to-digital converter as in claim 6, wherein said calibrating means determines said output digital signal from a product of said total slope count with a global gain calibration constant.

8. An analog-to-digital converter as in claim 6, wherein said total slope count is substantially linearly proportional to a voltage magnitude of said input analog signal.

9. An analog-to-digital converter as in claim 6, wherein the difference between said positive and negative slope counts corresponds to most significant bits of said output digital signal and said product of said calibration constant with said residual digital signal corresponds to least significant bits of said output digital signal.

10. An analog-to-digital converter as in claim 1, wherein said integrating means comprises a dual-slope integrator having a single runup slope such that one of said positive and said negative slope counts is zero.

11. A digital multimeter for measuring the voltage of an input analog signal, comprising:
means for integrating said input analog signal over a predetermined number of time intervals and thereby producing an integrated output, the integrated output being positive for a number of said predetermined time intervals corresponding to a positive slope count and negative for the remaining number of said predetermined time intervals corresponding to a negative slope count;
means for converting a residual analog signal remaining at an end of said predetermined number of time intervals into a residual digital signal; and
means for calibrating said residual digital signal so as to represent a fractional number of slope counts, whereby the voltage of said input analog signal is determined from a total slope count substantially equal to a sum of (1) said fractional number of slope counts and (2) a difference between said positive and negative slope counts.

12. A digital multimeter as in claim 11, wherein said integrating means comprises a multislope runup circuit.

13. A digital multimeter as in claim 12, wherein said converting means comprises a residual analog-to-digital converter.

14. A digital multimeter as in claim 13, wherein said calibrating means calibrates said residual digital signal by effectively multiplying said residual digital signal by a calibration constant.

15. A digital multimeter as in claim 14, wherein said calibration constant has a magnitude substantially equal to a magnitude of a full scale voltage of said residual analog-to-digital converter divided by a sum of absolute values of respective residual voltages left on said multislope runup circuit due to a change of one in the positive slope count and a change of one in the negative slope count when no external input is applied to said multislope runup circuit.

16. A digital multimeter as in claim 15, wherein a magnitude of said total slope count substantially equals a sum of (1) a difference between said positive and negative slope counts and (2) a product of said calibration constant with said residual digital signal.

17. A digital multimeter as in claim 16, wherein said calibrating means determines the voltage of said input analog signal from a product of said total slope count with a global gain calibration constant.

18. A digital multimeter as in claim 16, wherein said total slope count is substantially linearly proportional to a magnitude of the voltage of said input analog signal.

19. A digital multimeter as in claim 16, wherein the difference between said positive and negative slope counts corresponds to most significant bits of the voltage of said input analog signal and said product of said calibration constant with said residual digital signal corresponds to least significant bits of the voltage of said input analog signal.

20. A digital multimeter for measuring the voltage of an input analog signal, comprising:
a multislope runup circuit for integrating said input analog signal over a predetermined number of time intervals, said multislope runup circuit ramping positive for a first number of said predetermined number of time intervals and ramping negative for a second number of said predetermined number of time intervals;
an analog-to-digital converter for converting a residual analog voltage output of said multislope runup circuit into a residual digital signal; and
calibrating means for representing said residual digital signal as at least one fractional time interval of said multislope runup circuit, whereby a sum of (1) said at least one fractional time interval and (2) a difference between said first and second number of time intervals is substantially linearly proportional to a magnitude of the voltage of said input analog signal.

21. A method of converting an input analog signal into an output digital signal, comprising the steps of:
integrating said input analog signal over a predetermined number of time intervals and thereby producing an integrated output, the integrated output being positive for a number of said predetermined time intervals corresponding to a positive slope count and negative for a remaining number of said predetermined time intervals corresponding to a negative slope count;
converting a residual analog signal remaining at an end of said predetermined number of time intervals into a residual digital signal using a residual analog-to-digital converter; and
calibrating said residual digital signal so as to represent a fractional number of slope counts, whereby the output digital signal is determined from a total slope count substantially equal to a sum of (1) said fractional number of slope counts and (2) a difference between said positive and negative slope counts.

22. A method as in claim 21, wherein said integrating step is performed by a multislope runup circuit.

23. A method as in claim 22, wherein said calibrating step includes the step of effectively multiplying said residual digital signal by a calibration constant.

24. A method as in claim 23, wherein said calibrating step further includes a step of calculating the magnitude of said calibration constant by dividing a magnitude of a full scale voltage of said residual analog-to-digital converter by a sum of absolute values of respective residual voltages left on said multislope runup circuit due to a change of one in the positive slope count and a change of one in the negative slope count when no external input is applied to said multislope runup circuit.

25. A method as in claim 24, including the further step of calculating a magnitude of said total slope count as the sum of (1) a product of said calibration constant with said residual digital signal and (2) a difference between said positive and negative slope counts.

26. A method as in claim 25, including a further step of determining said output digital signal from the product of said total slope count with a global gain calibration constant.

27. A method as in claim 25, including the further step of outputting the difference between said positive and negative slope counts as the most significant bits of said output digital signal and said product of said calibration constant with said residual digital signal as the least significant bits of said output digital signal.

28. A method of measuring the voltage of an input analog signal, comprising the steps of:
integrating said input analog signal over a predetermined number of time intervals thereby producing an integrated output, the integrated output being positive for a number of said predetermined time intervals corresponding to a positive slope count and negative for a remaining number of said predetermined time intervals corresponding to a negative slope count;
converting a residual analog signal remaining at an end of said predetermined number of time intervals into a residual digital signal using a residual analog-to-digital converter;
calibrating said residual digital signal so as to represent a fractional number of slope counts; and
calculating the voltage of said input analog signal from a total slope count substantially equal to a sum of (1) said fractional number of slope counts and (2) a difference between said positive and negative slope counts.

29. A method as in claim 28, wherein said integrating step is performed by a multislope runup circuit.

30. A method as in claim 29, wherein said calibrating step includes the step of effectively multiplying said residual digital signal by a calibration constant.

31. A method as in claim 30, wherein said calibrating step further includes a step of calculating the magnitude of said calibration constant by dividing a magnitude of a full scale voltage of said residual analog-to-digital converter by a sum of absolute values of respective residual voltages left on said multislope runup circuit due to a change of one in the positive slope count and a change of one in the negative slope count when no external input is applied to said multislope runup circuit.

32. A method as in claim 31, wherein said calculating step includes the step of calculating a magnitude of said total slope count as a sum of (1) a product of said calibration constant with said residual digital signal and (2) a difference between said positive and negative slope counts.

33. A method as in claim 32, wherein said calculating step includes the step of determining the voltage of said input analog signal from a product of said total slope count with a global gain calibration constant.

34. A method as in claim 32, wherein said calculating step includes the step of representing the difference between said positive and negative slope counts as most significant bits of the voltage of said input analog signal and said product of said calibration constant with said residual digital signal as least significant bits of the voltage of said input analog signal.

35. A method of converting an input analog signal into an output digital signal, comprising the steps of:
(1) integrating said input analog signal with an integrator over a predetermined number of time intervals thereby producing an integrated output, the integrated output being positive for a number of said predetermined time intervals corresponding to a positive slope count and negative for a remaining number of said predetermined time intervals corresponding to a negative slope count;
(2) converting, with a residual analog-to-digital converter, a residual analog signal remaining at an end of said predetermined number of time intervals into a residual digital signal;
(3) zeroing said integrator;
(4) removing all external inputs from said integrator to allow said integrator to ramp positive for a duration of one of said predetermined time intervals;
(5) after said duration of one predetermined time interval, sampling and storing an integrator output V1;
(6) rezeroing said integrator;
(7) removing all external inputs from said integrator to allow said integrator to ramp negative for a duration of one of said predetermined time intervals;
(8) after said duration of one predetermined time interval, sampling and storing an integrator output V2;
(9) calculating a calibration constant as a quotient of a magnitude of a full voltage range of said residual analog-to-digital converter divided by a sum of a absolute values of V1 and V2;
(10) calibrating said residual digital signal by effectively multiplying said residual digital signal by said calibration constant so as to represent a fractional number of slope counts; and
(11) calculating a output digital signal from a magnitude of a total slope count substantially equal to a sum of (1) said fractional number of slope counts and (2), a difference between said positive and negative slope counts.

36. A method as in claim 35, wherein said steps (3)-(10) are periodically executed to keep said output digital signal substantially linear and calibrated.

37. A method as in claim 36, wherein said calculating step (11) includes the step of calculating said total slope count as a sum of (1) a product of said calibration constant with said residual digital signal and (2) a difference between said positive and negative slope counts.

38. A method as in claim 37, wherein said calculating step includes a further step of determining said output digital signal from the product of said total slope count with a global gain calibration constant.

* * * * *